United States Patent
Jefferies et al.

(10) Patent No.: US 9,283,852 B2
(45) Date of Patent: Mar. 15, 2016

(54) DIAGNOSTIC RECEPTACLE FOR ELECTRIC VEHICLE SUPPLY EQUIPMENT

(75) Inventors: Kevin M. Jefferies, Raleigh, NC (US); Benjamin W. Edwards, Knightdale, NC (US); Matthew L. White, Raleigh, NC (US); Konstantin Alexander Filippenko, Raleigh, NC (US); Richard Karl Weiler, Raleigh, NC (US)

(73) Assignee: Schneider Electric USA, Inc., Palatine, IL (US)

( * ) Notice: Subject to any disclaimer, the term of this patent is extended or adjusted under 35 U.S.C. 154(b) by 492 days.

(21) Appl. No.: 13/467,952

(22) Filed: May 9, 2012

(65) Prior Publication Data
US 2013/0300429 A1 Nov. 14, 2013

(51) Int. Cl.
*G01R 31/02* (2006.01)
*B60L 3/00* (2006.01)
*B60L 11/18* (2006.01)
(Continued)

(52) U.S. Cl.
CPC ........... *B60L 3/0069* (2013.01); *B60L 11/1818* (2013.01); *B60L 11/1825* (2013.01); *G01R 31/005* (2013.01); *G01R 31/006* (2013.01); *G01R 31/021* (2013.01); *G01R 31/04* (2013.01); *Y02T 10/7005* (2013.01); *Y02T 90/121* (2013.01); *Y02T 90/128* (2013.01); *Y02T 90/14* (2013.01)

(58) Field of Classification Search
CPC .. G01R 31/021; G01R 31/006; G01R 31/005; G01R 31/04
USPC ......................................... 324/511
See application file for complete search history.

(56) References Cited

U.S. PATENT DOCUMENTS 1,348,723 A * 8/1920 Lester ....................... B32B 7/06
280/37
2,712,103 A * 6/1955 Purifoy ................... B60L 15/34
318/64

(Continued)

FOREIGN PATENT DOCUMENTS

EP 1 770 845 A2 4/2007

OTHER PUBLICATIONS

EV Charging Systems Committee: "(R) SAE Electric Vehicle Conductive Charge Coupler J1772", 19961001, vol. J1772, No. Rev. Nov. 2001, pp. 1-32, Oct. 1, 1996.

(Continued)

*Primary Examiner* — Jermele M Hollington
*Assistant Examiner* — Christopher McAndrew
(74) *Attorney, Agent, or Firm* — Banner & Witcoff, Ltd.

(57) ABSTRACT

Systems, methods, apparatuses, and computer-readable media provide electric supply equipment 200 configured to perform diagnostics. The electric supply equipment 200 may include a receptacle 210 for forming a closed circuit loop. The electric supply equipment 200 includes a connector 203 for charging devices, such as electric vehicles 101. The connector 203 may include one or more conductors, some of which may be wrapped with insulation. When the connector 103, 203 is not used for charging, the connector 203 may be connected to a receptacle 210 of the electric supply equipment 200. Thus, the electric supply equipment 200, via the receptacle 210, may form a closed loop circuit with the conductors. Further, the electric supply equipment 200 may include a diagnostic unit 250 for performing diagnostic tests on the conductors. In particular, the diagnostic unit 250 may access ends of the conductors via the receptacle 210.

20 Claims, 4 Drawing Sheets

(51) Int. Cl.
*G01R 31/00* (2006.01)
*G01R 31/04* (2006.01)

(56) References Cited

U.S. PATENT DOCUMENTS

| | | | | |
|---|---|---|---|---|
| 2,858,507 | A * | 10/1958 | Liautaud | G01R 27/18 324/510 |
| 5,132,611 | A * | 7/1992 | Brewer, Jr. | G01R 31/006 324/126 |
| 5,172,062 | A * | 12/1992 | Eisermann | G01R 31/007 324/503 |
| 5,869,951 | A * | 2/1999 | Takahashi | G01R 31/361 320/104 |
| 6,373,255 | B2 * | 4/2002 | Tury | H05B 37/03 324/414 |
| 6,690,174 | B2 * | 2/2004 | Sigwart | G01M 99/002 324/501 |
| 6,703,841 | B2 * | 3/2004 | Scilla | H01R 13/6691 324/511 |
| 6,737,868 | B2 * | 5/2004 | Takagi | G01R 31/44 324/414 |
| 6,771,079 | B2 * | 8/2004 | Lin | H01H 85/32 307/10.1 |
| 6,919,726 | B2 * | 7/2005 | Yudahira | B60L 3/0023 324/511 |
| 7,427,865 | B2 * | 9/2008 | Elder | B60L 3/0046 180/65.31 |
| 7,777,495 | B2 * | 8/2010 | Mannerfelt | B60Q 1/305 324/414 |
| 7,990,093 | B2 * | 8/2011 | Kezobo | B62D 5/0484 318/432 |
| 8,108,191 | B1 * | 1/2012 | Britch | G01M 13/02 318/139 |
| 8,195,355 | B2 * | 6/2012 | Inoue | F02D 41/22 324/511 |
| 8,340,829 | B2 * | 12/2012 | Jackson | H02H 3/332 324/509 |
| 8,575,940 | B2 * | 11/2013 | Yugou | B60L 3/04 307/10.1 |
| 8,581,596 | B2 * | 11/2013 | Kagoshima | B60L 3/0061 290/40 C |
| 2002/0011935 | A1 * | 1/2002 | Kim | B60K 6/46 340/635 |
| 2008/0036467 | A1 * | 2/2008 | Butler | G05B 9/02 324/511 |
| 2008/0164883 | A1 * | 7/2008 | Chen | G01R 31/02 324/511 |
| 2010/0289516 | A1 * | 11/2010 | Mitsutani | B60L 3/00 324/764.01 |
| 2011/0029144 | A1 * | 2/2011 | Muller | B60L 11/1816 700/293 |
| 2011/0055037 | A1 * | 3/2011 | Hayashigawa | B60L 3/0069 705/26.1 |
| 2011/0169447 | A1 * | 7/2011 | Brown | B60L 3/0069 320/109 |
| 2011/0172839 | A1 * | 7/2011 | Brown | B60L 3/0069 700/292 |
| 2011/0216452 | A1 | 9/2011 | Haines et al. | |
| 2012/0022811 | A1 * | 1/2012 | Dickinson | B60L 11/1816 702/60 |
| 2012/0025842 | A1 * | 2/2012 | Gibbs | G01R 31/045 324/538 |
| 2012/0206100 | A1 * | 8/2012 | Brown | B60L 3/0069 320/109 |

OTHER PUBLICATIONS

International Application No. PCT/US2013/040247—International Search Report dated Jan. 2, 2014.

* cited by examiner

DIAGNOSTIC RECEPTACLE FOR ELECTRIC VEHICLE SUPPLY EQUIPMENT

FIELD OF ART

Aspects of the disclosure generally relate to electric vehicle supply equipment, and in particular, to electric vehicle supply equipment comprising a receptacle and diagnostic unit for evaluating the status (e.g., "health") of one or more conductors of the electric vehicle supply equipment.

BACKGROUND

Demand for electric supply equipment is growing as the desire to reduce the global dependency on fossil fuels increases. As technology related to electric motors advances, more and more electric motors replace combustion engines. This effect has already begun in the automotive industry. Today, hybrid and electric vehicles are becoming increasingly popular. Accordingly, demand for supplying these vehicles with electric power is rising. One of the obstacles to integrating electric vehicles into society is the availability and adequacy of electric vehicle supply equipment. To overcome this obstacle, attempts have been made to standardize aspects of electric vehicle supply equipment. As a result of these attempts, product standards such as SAE J1772, UL2594, and UL2231 have been developed. While these standards have aided the integration of electric vehicles, many challenges for providing electric vehicle supply equipment remain.

Accordingly, new systems and methodologies are required to improve the user friendliness, safety, and cost of electric supply equipment, such as electric vehicle supply equipment.

BRIEF SUMMARY

In light of the foregoing background, the following presents a simplified summary of the present disclosure in order to provide a basic understanding of some aspects of the invention. This summary is not an extensive overview of the invention. It is not intended to identify key or critical elements of the invention or to delineate the scope of the invention. The following summary merely presents some concepts of the invention in a simplified form as a prelude to the more detailed description provided below.

In accordance with various aspects of the disclosure, methods, computer-readable media, and apparatuses are disclosed to perform diagnostics on electric supply equipment. The methods, computer-readable media, and apparatuses disclosed herein may be used for various electric supply equipment. In particular, the methods, computer-readable media, and apparatuses disclosed herein may be used for electric vehicle supply equipment, such as a charging station for charging an electric vehicle, which herein refers to any vehicle that uses an electric motor to propel itself.

Aspects of the disclosure provide an improved electric vehicle charging station. Specifically, this disclosure provides diagnostic circuitry for performing various diagnostics to monitor the functionality, safety, and condition (i.e., "health") of the charging station and its components, e.g., its connectors and its cable. Additional aspects include a diagnostic receptacle for an electric vehicle charging station. This diagnostic receptacle provides a connection for the cable when it is not being used for charging an electric vehicle. Accordingly, through the diagnostic receptacle, a closed circuit loop, including the cable, may be formed so that diagnostics may be performed on the charging station. The diagnostic receptacle therefore functions as an interface for the diagnostic circuitry.

Of course, the methods and systems of the above-referenced embodiments may also include other additional elements, steps, computer-executable instructions or computer-readable data structures. In this regard, other embodiments are disclosed and claimed herein as well. The details of these and other embodiments of the present disclosure are set forth in the accompanying drawings and the description below. Other features and advantages of the invention will be apparent from the description and drawings and from the claims.

BRIEF DESCRIPTION OF THE DRAWINGS

The present disclosure is illustrated by way of example and is not limited in the accompanying figures in which like reference numerals indicate similar elements and in which.

DETAILED DESCRIPTION

This disclosure provides a non-exhaustive description of various embodiments of the diagnostic receptacle and diagnostic circuitry and their respective features. The objectives of the diagnostics may vary, and thus, numerous combinations of features exist. For example, one objective may be to alert a user (e.g., a customer, owner, etc.) that a charging station is inoperable before the user attempts to charge his/her vehicle. Another objective may be to identify a specific reason or set of possible reasons that the charging station is malfunctioning or not functioning at all. Yet another objective may be to detect and announce a condition compromising the performance or usability of the charging station. Depending on the objective(s) of a particular embodiment, different components may be used to implement the electric supply equipment, specifically the diagnostic receptacle and diagnostic circuitry of the electric supply equipment.

In the following description of the various embodiments of the disclosure, reference is made to the accompanying drawings, which form a part hereof, and which show, by way of illustration, various embodiments in which the disclosure may be practiced. It is to be understood that other embodiments may be utilized and structural and functional modifications may be made.

Figure 1:
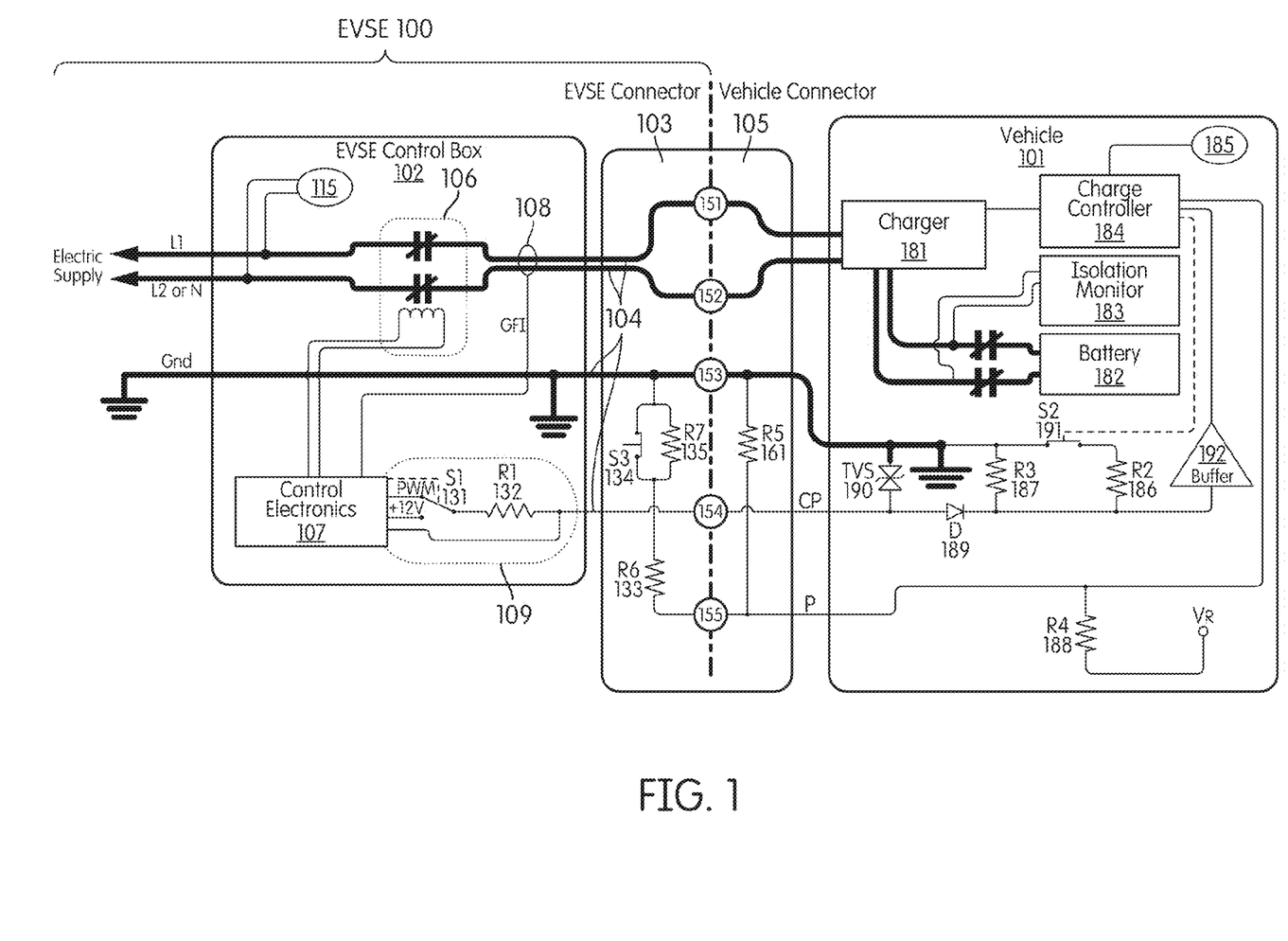
FIG. 1 is a diagram illustrating an example configuration of electric vehicle supply equipment according to an aspect of the present disclosure.

FIG. 1 is a diagram illustrating an example configuration of an electric supply device according to an aspect of the present disclosure. More specifically, FIG. 1 illustrates an example configuration of electric vehicle supply equipment (EVSE) 100, which is one type of electric supply device. It should be understood that FIG. 1 does not show all components of the EVSE 100, and instead focuses on some basic components of the EVSE 100, as specified in "SAE Recommended Practice J1772, SAE Electric Vehicle and Plug in Hybrid Electric Vehicle Conductive Charge Coupler" (hereinafter referred to as J1772). Further, FIG. 1 shows the EVSE 100 in a state in which it is connected to and charging an electric vehicle 101. Therefore, in addition to showing some basic components of the EVSE 100, FIG. 1 also shows some of the basic components of the electric vehicle 101.

As shown in FIG. 1, the EVSE 100 includes an EVSE control box 102, an EVSE connector (i.e., plug) 103, and a cable 104 that connects the EVSE control box 102 to the EVSE connector 103. The cable 104 may be fixedly or removably connected to the EVSE control box 102 and/or the EVSE connector 103. From a safety standpoint, it may be desirable to fixedly connect the cable 104 to the EVSE control box 102 and EVSE connector 103. In contrast, for various reasons (e.g., more economical, easier to fix, etc.), it may be desirable to easily remove the cable 104 from the EVSE control box 102 and/or connector 103. For example, if it is determined that the cable 104 is defective (e.g., insulation is damaged, discontinuity exists in conductors, etc.), the cable 104 may be removed and replaced with a new cable. Thus, the cable 104 may be replaced without replacing the entire EVSE 100. Meanwhile, the EVSE connector 103 is configured to be removably connected to a vehicle connector 105 (e.g., a vehicle inlet) of one or more electric vehicles 101. That is, the EVSE connector 103 should comply with relevant standards so that it may connect with a plurality of electric vehicles 101. One non-limiting example standard is J1772. This disclosure contemplates that standards may change and/or new standards may be adopted, and thus, aspects of the disclosure may be adapted accordingly.

As mentioned above, FIG. 1 illustrates an embodiment in which an electric power source drives current from the EVSE 100 through the cable 104 to the electric vehicle 101. In the embodiment of FIG. 1, the electric power source may supply alternating current (AC) power. However, in other embodiments, the electric power source may supply direct current (DC) power. Also, the electric power source may be configured to supply various levels of electric power. For example, the electric power source may provide 120 VAC and/or 240 VAC. Moreover, in a case in which AC power is supplied, the frequency of the alternating current may vary (e.g., 60 Hz, 50 Hz). The cable 104 may include a plurality of conductor lines for delivering the electric power supply. Specifically, the cable 104 may include a first power line L1 and a second power line L2/N for carrying current and supplying electric power. Additionally, the cable 104 may include a ground line Gnd that couples the equipment ground terminal of the EVSE 100 to the chassis ground of the electric vehicle 101 during charging. Each of the conductor lines (i.e., the first power line L1, the second power line L2/N, and the ground line Gnd) may include copper, aluminum, or other conductive materials wrapped with an insulator. The three lines may be wrapped together by a second insulator. Thus, from the user's perspective, the cable 104 may appear to be a single wire. In some embodiments, the cable 104 may also include additional conductors, such as a control pilot line CP (discussed in further detail below), DC power lines (not shown), etc.

The EVSE control box 102 refers to a main structure that houses one or more components of the EVSE 100. Although shown as a single structure, the EVSE control box 102 may be the compilation of multiple separate structures. The EVSE control box 102 may include an electric supply indicator 115.

Further, the EVSE control box 102 may include a contactor 106 for de-energizing the EVSE 100. The contactor 106 functions like a switch (or relay) to open and close a path through the first and second power lines L1 and L2 for current to pass. As shown in FIG. 1, the contactor 106 is located between the electric power source and the cable 104, and therefore, acts to connect or disconnect the electric power source to the cable 104. When the contactor 106 is in a closed state, current is able to pass from the electric power source through the first and second power lines L1 and L2 to the cable 104. In contrast, when the contactor 106 is in an open state, current cannot pass from the electric power source to the cable 104. Moreover, the contactor 106 is especially suited for de-energizing the first and second power lines L1 and L2 so that electric charge on the cable can be quickly and safely removed.

The EVSE control box 102 may also include control electronics 107 for controlling the contactor 106. More specifically, the control electronics 107 control whether the contactor 106 is in the open state or closed state, and therefore, control when to de-energize the first and second power lines L1 and L2. The control electronics 107 may comprise various circuit components, such as resistors, capacitors, inductors, etc., and/or be implemented with one or more integrated circuits. In some embodiments, the control electronics 107 may be implemented on a printed circuit board (PCB).

In addition, the EVSE control box 102 may include a ground fault interrupter (GFI) 108 for detecting differential current between the first power line L1 and the second power line L2/N. When the differential current exceeds a threshold, the GFI may transmit a signal to the control electronics 107, which in response may switch the contactor 106 to the open state.

Further, the control electronics 107 may also interface with a monitoring circuit 109. The monitoring circuit 109 may be coupled to the control pilot line CP through which it may generate a control pilot signal. In one or more arrangements, such as that shown in FIG. 1, the monitoring circuit 109 may include a switch (S1) 131 and resistor (R1) 132, and a pulse width modulation (PWM) signal generator or other oscillator (not shown) for generating an oscillating signal (e.g., a PWM signal). The monitoring circuit 109 may monitor a voltage on the control pilot line CP. Based on the detected voltages, the monitoring circuit 109 and control electronics 107 may determine a state of the electric vehicle 101. For example, the monitoring circuit 109 and control electronics 107 may determine whether the electric vehicle 101 is connected to the EVSE 100 or not and/or whether the electric vehicle 101 is ready to be charged. Although the monitoring circuit 109 is shown separately, it may be incorporated into the control electronics 107.

Still referring to FIG. 1, the EVSE connector 103 may include five contact points 151-155 configured to electrically couple the EVSE connector 103 to the vehicle connector 105 (e.g., a vehicle inlet) of the electric vehicle 101. The contact points 151-155 may provide a connection to the first power line L1, the second power line L2/N, the ground line Gnd, the control pilot line CP, and a proximity line P, respectively. Although five contact points 151-155 are shown in FIG. 1, the number of contact points may be different in other embodiments. In some embodiments, one or more of the five contact points 151-155 may include prongs (which may protrude from a base structure of the EVSE connector 103) that are configured to be inserted into the vehicle connector 105 of the electric vehicle 101. The vehicle connector 105 may include a resistor (R5) 161 coupled between the ground line Gnd and the contact point 155.

Further, the EVSE connector 103 may include the proximity circuit. The proximity circuit may detect the presence of the EVSE connector 103 at the vehicle connector 105. In response to detecting that the EVSE connector 103 is connected to the vehicle connector 105, the proximity circuit may transmit a signal to the electric vehicle 101 thereby notifying the electric vehicle 101 of the presence of the EVSE connector 103. Thus, in response to receiving a signal from the proximity circuit, the electric vehicle 101 may prepare for charging. Numerous configurations may be implemented to provide the proximity circuit. As shown in FIG. 1, the proximity circuit may include a resistor (R6) 133 coupled in series with both a switch (S3) 134 and a resistor (R7) 135, which are in parallel with one another. One end of the resistor (R6) 133 may be coupled to the proximity circuit contact 155. Meanwhile, an end of the switch (S3) 134 and resistor (R7) 135, which are in parallel, is coupled to the ground line Gnd. The switch (S3) 134 may be actuated manually (e.g., by a user pressing a button) or mechanically (e.g., by a latch that slides when a user connects the EVSE connector 103 to the vehicle connector 105). In one or more arrangements, the switch (S3) 134 may be configured to only close when the EVSE connector 103 is connected to a specific connector (e.g., the vehicle connector 105 or a receptacle further described below).

Turning to the electric vehicle 101, although the electric vehicle 101 may include many parts, FIG. 1 shows only some parts that are related to charging the electric vehicle 101. Specifically, FIG. 1 shows that the electric vehicle 101 may include a charger 181, a battery 182, an isolation monitor 183, a charge controller 184, a charge status indicator 185, and circuit components, such as resistors (R2-R4) 186-188, a diode (D) 189, a transient-voltage-suppression diode (TVS) 190, a switch (S2) 191, and a buffer 192.

Figure 2:
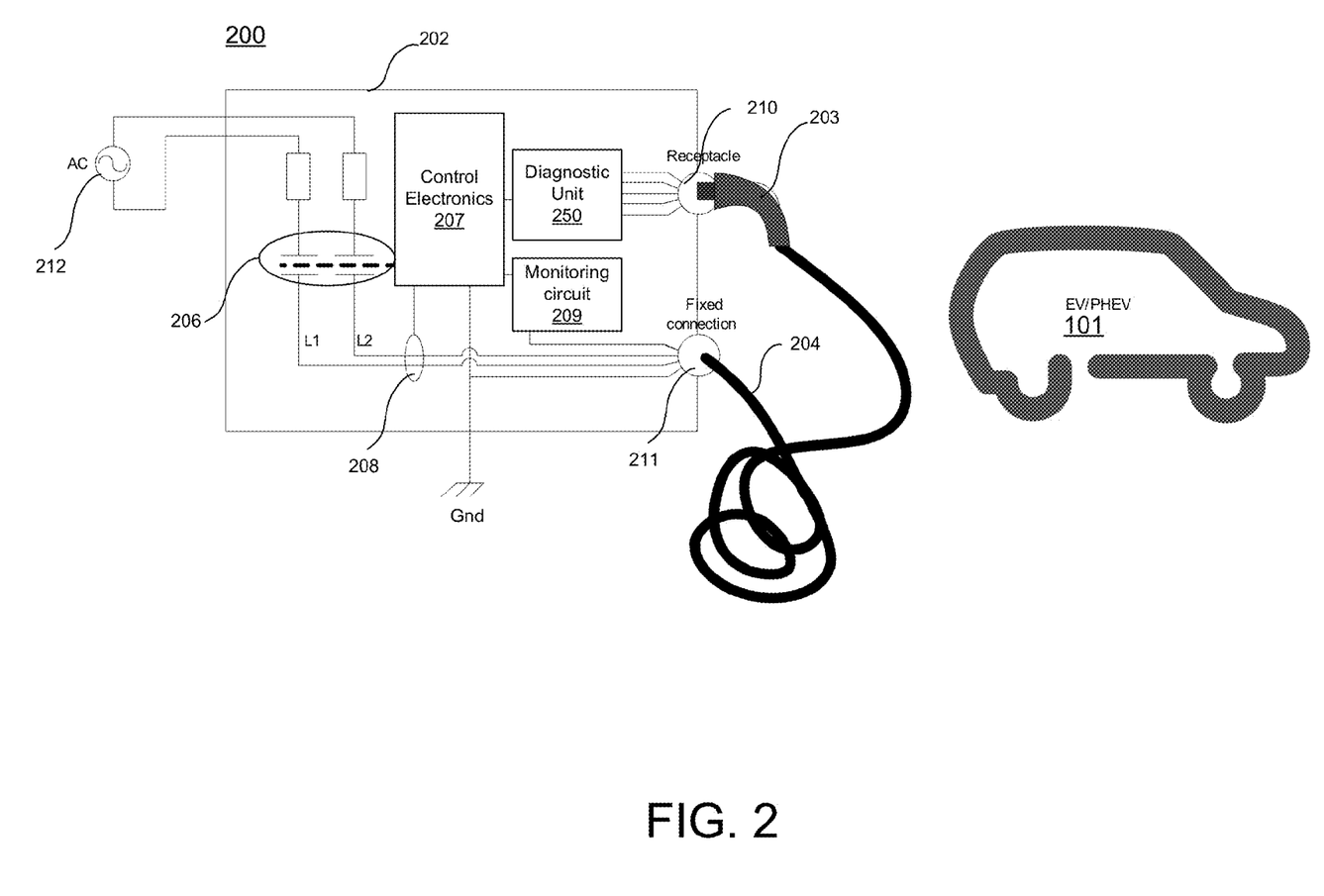
FIG. 2 is a diagram illustrating another example configuration of electric vehicle supply equipment according to an aspect of the present disclosure.

FIG. 2 illustrates another example embodiment of EVSE 200. More specifically, FIG. 2 illustrates the EVSE 200 including an EVSE control box 202, an EVSE connector 203, a cable 204, and a receptacle 210. The receptacle 210 may be configured to hold the EVSE connector 203 when the EVSE 200 is not in use (i.e., is not charging an electric vehicle). Further, the receptacle 210 may include contact points configured to provide an electrical connection to one or more of the contact points of the EVSE connector 203. For example, the receptacle 210 may include five contact points to electrically connect to the five contact points of the EVSE connector 203, respectively. Accordingly, an aspect of the receptacle 210 may be to provide electrical access to the EVSE connector 203 so that a closed circuit loop may be established within the EVSE 200. For example, the receptacle 210 may electrically couple the EVSE connector 203 with a circuit in the EVSE 200 that closes the loop by creating a current path between the first power line L1 and the second power line L2/N. Also, the receptacle 210 may form a closed loop with any of the conductors by connecting them to ground (e.g., to the equipment ground terminal of the EVSE 200).

Without the receptacle 210, the cable 204 may be only coupled to the EVSE 200 at a fixed connection point 211 on the EVSE control box 202. Further, without the receptacle 210, if the EVSE 200 is not charging an electric vehicle 101, the conductor ends would be electrically disconnected and would terminate in the EVSE connector 203 thereby resulting in an open loop circuit. Hence, the receptacle 210 essentially extends the cable 204, including its conductors, such as the first and second power lines L1 and L2/N, back to a portion of the EVSE 200 where the conductors can be accessed. Because the receptacle 210 allows access to the ends of the conductors in the cable 204, tests may be performed using the ends of the conductors. Also, tests may be performed on any of the conductor lines in the cable 204 individually, or on a combination of the conductor lines of the cable 204. Such diagnostic tests that incorporate measurements taken at the ends of the conductor lines in the cable 204 may be more accurate, economical, reliable, and/or feasible.

Further, the receptacle 210 may include circuitry for interfacing with the proximity circuitry of the EVSE connector 203. For example, the receptacle 210 may include similar circuitry to that of the vehicle connector 105 (e.g., resistor (R5) 161 of FIG. 1) and that of the electric vehicle 101 (e.g., resistor (R4) 188 coupled to a regulated voltage $V_R$ of FIG. 1) that is coupled with the proximity circuitry of the EVSE connector 103. Therefore, the EVSE 200 may include a proximity circuit configured to detect whether the EVSE connector 203 is electrically connected to the receptacle 210. Also, the receptacle 210 may include circuitry similar to the circuitry in the electric vehicle 101 that is connected to the control pilot line CP and used in conjunction with the monitoring circuit 209 (e.g., diode (D) 189, resistors (R2 and R3) 186 and 187, switch (S2) 191, etc.). Thus, when connected to the receptacle 210, the monitoring circuit 209 may monitor circuitry in the receptacle 210 (or elsewhere in the EVSE 200). Accordingly, tests may be performed by changing the state of the circuitry in the receptacle 210 (or elsewhere in the EVSE 200) to emulate states of the electric vehicle 101. For example, the receptacle 210 may turn on/off a switch to emulate switch (S2) 191 (see FIG. 1) of an electric vehicle 101, and diagnostics may be performed to evaluate how the control electronics 207 react (e.g., do they properly control the contactor 206).

Another aspect of the receptacle 210 may be to hold the EVSE connector 203 in place to provide a reliable electrical connection to the ends of the conductor lines and the EVSE 200. In some embodiments, the contact points of the receptacle 210 may be recessed so that prongs of the EVSE connector 203 may be inserted into recesses to hold the EVSE connector 203 firmly in place. The receptacle 210 may also be shaped to hold the EVSE connector 203 in position so that it stays electrically connected to the contact points of the receptacle 210 when the EVSE 200 is not in use. Additionally, or alternatively, other devices, such as hooks, magnets, clips, latches, etc., may be used to hold the EVSE connector 203 steady while it is connected to the receptacle 210. Further, the receptacle 210 and/or EVSE connector 203 may include a locking mechanism to lock the receptacle 210 and EVSE connector 203 together so that the EVSE connector 203 cannot be removed from the receptacle 210 at certain times (e.g., when the performance and/or electrical characteristics of the EVSE 200 are compromised, when charging is not authorized, etc.).

Moreover, the receptacle 210 may be formed from the same structure as the control box 202. That is, the control box 202 may be shaped to form the receptacle 210. Alternatively, the receptacle 210 may be a separate component that may be fixedly attached to the control box 202. Numerous constructions of the receptacle 210 are contemplated that allow the receptacle 210 to receive and electrically connect to the EVSE connector 203. Also, since the EVSE connector 203 is to be connected to the receptacle 210 when it is not connected to the electric vehicle 101, the receptacle 210 may be located on the EVSE 200 in a position so that it may be accessible to a user. In other words, the receptacle 210 may be positioned so that a user can readily connect and disconnect the EVSE connector 203 from the receptacle 210. Also, in one or more arrangements, the receptacle 210 may be located behind a protective covering (e.g., a plastic door), which may protect the receptacle 210 from external conditions, such as rain, wind, and animals. The protective covering may assist in reducing the likelihood of the EVSE connector 203 from becoming disconnected from the receptacle 210.

Still referring to FIG. 2, the EVSE control box 202 may include a contactor 206, control electronics 207, a GFI 208, and monitoring circuit 209 respectively configured in a similar manner as the contactor 106, control electronics 107, GFI 108, and monitoring circuit 109 of FIG. 1. In addition, the EVSE control box 202 may include a diagnostic unit 250. As shown in FIG. 2, one or more of the contact points in the receptacle 210 may be electrically coupled to certain components (e.g., capacitors, resistors, transistors, etc.) in the diagnostic unit 250. Accordingly, the EVSE 200 may include a closed loop circuit via the receptacle 210 and diagnostic unit 250. Thus, the receptacle 210 provides a current path from the diagnostic unit 250 to accessible ends of the conductor lines (e.g., the first and second power lines L1 and L2/N, the proximity line P, the control pilot line CP, and the ground line Gnd) terminating within the EVSE connector 203. An aspect of the diagnostic unit 250 is to generate and transmit a stimulus (e.g., various test signals) through this current path onto the conductors within the EVSE connector 203 and cable 204 in order to perform diagnostic tests and obtain electrical measurements described in further detail below.

Although FIG. 2 depicts the conductor lines of the cable 204 being connected to the diagnostic unit 250, it should be understood that the diagnostic unit 250 may include additional components (e.g., capacitors, resistors, transistors, etc.) that are electrically isolated from the conductors of the cable 204. For example, the diagnostic unit 250 may include diagnostic electronics (e.g., circuitry including resistors, capacitors, transistors, integrated circuits, etc.) that are electrically isolated from the first and second power lines L1 and L2/N thereby allowing the diagnostic unit 250 to perform isolated tests.

The diagnostic unit 250 may perform one or more diagnostic operations (or tests) for monitoring and evaluating a status (e.g., a condition, functionality, safety, availability, efficiency, etc.) of the EVSE 200. For example, the diagnostic unit 250 may be configured to determine whether a conductor of the EVSE 200 is damaged and/or whether an insulation of the conductor is damaged. Herein, a damaged element may refer to any undesired condition of the element, which may vary from embodiment to embodiment. The diagnostic unit 250 may include various diagnostic electronics depending on the capabilities of the diagnostic unit 250. Accordingly, there is no one particular configuration of the diagnostic unit 250.

In one or more arrangements, the diagnostic unit 250 may be configured to take one or more electrical measurements. While the diagnostic unit 250 may perform measurements at numerous points, an aspect of the present disclosure allows the diagnostic unit 250 to perform measurements at ends of the conductors in the cable 204 that are exposed by the EVSE connector 203. One function of the diagnostic unit 250 may be to measure the individual continuity and/or resistance (or impedance) of one or more conductors of the EVSE 200. For example, the diagnostic unit 250 may measure the continuity and/or resistance of the first power line L1 and the continuity and/or resistance of the second power line L2/N. Additionally, or alternatively, the diagnostic unit 250 may measure the capacitance between any two conductors. For example, the diagnostic unit 250 may measure the capacitance between the first power line L1 and the second power line L2/N. Based on the capacitance measurements, the diagnostic unit 250 may determine that the insulation for one or more of the conductors may be damaged. Further, the diagnostic unit 250 may measure the voltage at one or more points, and therefore, may determine the voltage drop between different portions of the circuit loop. Similarly, the diagnostic unit 250 may measure current at one or more points in the circuit. For example, the diagnostic unit 250 may measure the current at or near the AC electric supply 212 and/or the current at or near the EVSE connector 203. In some embodiments, the diagnostic unit 250 may determine insulation breakdown and leakage current between any of the conductors. As a result of such determinations, the diagnostic unit 250 may detect insulation problems that might lead to compromised performance and/or electrical characteristics of the EVSE 200, including arcing faults, and/or excessive leakage currents, while charging the electric vehicle 101. Further details on how to perform the measurements and carry out the diagnostic tests disclosed herein are omitted because such methods and techniques are understood by persons of ordinary skill in the art.

Also, the diagnostic unit 250 may measure the contact resistance of one or more of the contact points in the EVSE connector 203. For example, the diagnostic unit 250 may measure the contact resistance of the contact point at which the first power line L1 would transfer current to the electric vehicle 101 if it were connected to the electric vehicle 101. Depending on the measured contact resistance of each of the contact points, the diagnostic unit 250 may determine whether corrosion exists on any of the contact points of the EVSE connector 203. Accordingly, where the diagnostic unit 250 determines that corrosion exists, the diagnostic unit 250 may alert an owner or operator so that the cable 204, the EVSE connector 203, or the corroded contact points themselves may be replaced.

A frequency of the control pilot signal may also be measured by the diagnostic unit 250. An electric vehicle 101 may not accept an electric charge if it determines that the frequency of the control pilot signal transmitted over the control pilot line CP is outside of a predetermined range. Therefore, the diagnostic unit 250 may be configured to measure the frequency and determine whether it falls within the predetermined range. In some embodiments, the diagnostic unit 250 may communicate with the control electronics 207 to cause the control electronics 207 to adjust the frequency so that it falls within the predetermined range. Additionally and/or alternatively, where pulse width modulation (PWM) is used to generate the control pilot signal, the diagnostic unit 250 may measure the pulse width of the control pilot signal. Further, the diagnostic unit 250 may communicate with the control electronics 207 to cause the control electronics 207 to modify the pulse width of the control pilot signal. In one or more arrangements, the diagnostic unit 250 may monitor the response times associated with modifying the frequency and/or pulse width of the control pilot signal and determine whether the response times are acceptable (e.g., within some predetermined threshold).

The diagnostic unit 250 may take time domain reflectometry (TDR) measurements as well. Such measurements might be used to monitor the condition of the conductors in, for example, the cable 204. In some embodiments, only relative TDR measurements are taken to detect changes in a reflected signal. From the TDR measurements, a length of the conductors (e.g., a length of the cable) may be detected and/or discontinuities along the conductors may be located.

To perform the determinations described herein, the diagnostic unit 250 may compare its measurements to one or more predetermined thresholds and/or variable thresholds (e.g., thresholds derived from an algorithm or learned by a neural network). For example, to determine whether corrosion exists, the measured contact resistance may be compared with a contact resistance threshold. If the measured contact resistance of one or more of the conductors exceeds the contact resistance threshold, the diagnostic unit 250 may determine that corrosion exists. On the contrary, if the measured contact resistance of one or more of the conductors does not exceed the contact resistance threshold, the diagnostic unit 250 may determine that corrosion does not exist. Further, determinations may be made on a per conductor basis, or the conductors may be evaluated collectively so that if one conductor is determined to be corroded, then all of the conductors are determined to be corroded. Accordingly, different thresholds may be implemented depending on whether the conductor is being evaluated on a per conductor basis or the conductors are being evaluated together. For example, if the sum of the measured contact resistance of the contact points exceeds a collective threshold, the diagnostic unit 250 may determine that the EVSE connector 203 is corroded, and thus, may alert an owner that it should be replaced. While the above description explains how thresholds may be used to reach determinations based on contact resistance measurements, it should be understood that contact resistance is used as an example measurement and that other thresholds may be similarly used to reach determinations based on other electrical measurements.

In some embodiments, the diagnostic unit 250 may evaluate the monitoring circuit 209. Specifically, the diagnostic unit 250 may emulate an electric vehicle's response, and may determine if the monitoring circuit 209 reacts properly. That is, the diagnostic unit 250 may determine if the monitoring circuit 209 detects the proper voltage so that if it were connected to an electric vehicle 101, it would correctly determine a state of the vehicle 101 (e.g., whether the electric vehicle is ready to be charged). To emulate the different states of an electric vehicle 101, the diagnostic unit 250 may include one or more parallel resistors similar to resistors (R2 and R3) 186 and 187 of FIG. 1 and a switch similar to the switch (S2) 191 of FIG. 1. Alternatively, the diagnostic unit 250 may operate such a switch located in the receptacle 210. By operating such a switch and communicating with the control electronics 207, the diagnostic unit 250 may determine whether the monitoring circuit and control electronics 207 are functioning properly. For example, the diagnostic unit 250 may determine whether the control electronics 207 would open the contactor 206 in response to detecting that the electric vehicle 101 is not properly connected to the EVSE 200. In some embodiments, the diagnostic unit 250 may even detect the time it takes to open and close the contactor 206 to ensure that industry standards or self-imposed safety precautions are met. Further, the diagnostic unit 250 may measure voltages to detect a welded contactor 206 and to check the voltage levels on various conductors within the EVSE 200.

Another function of the diagnostic unit 250 may be to detect electric arcing. In particular, the diagnostic unit 250 may be configured to detect parallel arcing (e.g., low current arcing) between conductors (e.g., the first power line L1 and the second power line L2/N) and/or series arcing. Various electronics may be used to detect parallel and/or series arcing. For example, a thermal and/or magnetic sensor may be used to detect excessive heat or current, and therefore, determine that arcing has occurred.

Current arcing can damage the EVSE 200, and render it inoperable for charging electric vehicles 101. Specifically, current arcing can short circuits and/or melt conductors and their insulation. Also, in some cases, current arcing may cause a fire, and therefore, can be dangerous to a user. When parallel arcing is detected, the diagnostic unit 250 may determine that the arcing is due to damaged insulation. Therefore, the diagnostic unit 250 may alert a potential user of the EVSE 200 that the EVSE 200 is not properly functioning or is unsafe for use. Additionally, or alternatively, the diagnostic unit 250 may notify an owner or operator of the EVSE 200 that, for example, the insulation within the cable 204 is damaged and that the cable 204 needs to be replaced. In some embodiments, the diagnostic unit 250 may allow for early detection of current arcing so that parts can be fixed before they become damaged beyond practical repair.

Yet another example function of the diagnostic unit 250 may include performing high impedance fault detection. By performing high impedance fault detection, the diagnostic unit 250 may detect impedance discontinuities in the EVSE 200. Impedance discontinuities may be detected by detecting reflections in the current. Reflections are generated at the point of an impedance discontinuity, and therefore, by detecting a reflection in the current, the diagnostic unit 250 may determine the existence of an impedance discontinuity. Further, because discontinuities formed in areas of high impedance may result in hotspots (i.e., regions of high temperature), the diagnostic unit 250 may also determine whether hotspots exist within the EVSE 200. Moreover, the diagnostic unit 250 may also determine where (e.g., in the cable 204, in the EVSE connector 203, etc.) hotspots exist. In some cases, discontinuities may result in the inability of the EVSE 200 to charge the electric vehicle 101. The diagnostic unit 250 may determine whether the discontinuity rises to a certain degree indicating that such case might exist (i.e., that the EVSE 200 might not be able to charge the electric vehicle 101).

Still another aspect of the diagnostic unit 250 may include the ability to diagnose whether conductors of the EVSE 200 are in an exposed or unexposed state. Herein, the exposed state of the conductors refers to any state in which any portion of the conductors are exposed (or not shielded from a user), while the unexposed state of the conductors refers to a state in which all portions of the conductors are unexposed (i.e., shielded from the users). In an exposed state, the EVSE connector 203 may be improperly coupled to the receptacle 210 (e.g., loosely hanging onto the receptacle 210), on the ground, in a puddle, in a user's hand, disconnected from the cable 204, etc. It may be desirable to prevent the EVSE 200, users or others from electrically energizing the cable 204 while the conductors in the cable 204 and in the EVSE connector 203 are in the exposed state. Thus, when the diagnostic unit 250 determines that the conductors of the EVSE 200 are exposed, it may alert others as well as the EVSE control electronics 207. In an unexposed state, the EVSE connector 203 may be properly connected to the receptacle 210 so that users and others are shielded from electric charges in the conductors. That is, the contact points of the conductors in the EVSE connector 203 may be inserted into the receptacle 210 such that the conductors are not exposed. In some embodiments, the diagnostic unit 250 may also notify others that the EVSE 200 is safe to use and/or available for use when the diagnostic unit 250 determines that the conductors are in the unexposed state. In addition to indicating the availability and/or safety of the EVSE 200, determining whether the conductors are exposed or not may be performed as a preliminary matter before executing additional diagnostics.

The determination of whether the conductors are exposed or not may be based on whether the EVSE connector 203 is connected to the receptacle 210. Determining whether the EVSE connector 203 is connected to the receptacle 210 may be performed by a proximity circuit located in the EVSE connector 203 and the receptacle 210. As discussed above with reference to FIG. 1, the EVSE connector 203 may include electrical components, such as resistors (R6 and R7) 133 and 135 and switch (S3) 134, for forming a proximity circuit. When the EVSE connector 203 is connected to the electric vehicle 101, the switch (S3) 134 may close thereby generating a signal, which is transmitted to the electric vehicle 101 to indicate that the EVSE connector 203 is connected to the electric vehicle 101. Likewise, the receptacle 210 may include a contact for receiving a similar signal when the EVSE connector 203 is connected to the receptacle 210. That is, when the EVSE connector 203 is connected to the receptacle, the switch (S3) 134 in the EVSE connector 203 may be switched to a closed position. In some embodiments, the switch (S3) 134 may be closed manually by a user once the EVSE connector 203 is connected to the receptacle 210. That is, a user may operate a manual device, such as a button, a toggle switch, a lever, etc. to close the switch (S3) 134. Additionally, or alternatively, the switch (S3) 134 may be closed by a mechanical device, such as a latch or magnet, that closes the switch (S3) 134 in response to the EVSE connector 203 being connected to the receptacle 210. In some embodiments, such a mechanical device may be fitted to the receptacle 210 so that the receptacle 210 always closes the switch (S3) 134 when the EVSE connector 203 is connected thereto. In any event, however the switch (S3) 134 becomes closed, a signal may be generated as a result thereof. This generated signal may then be transmitted via a contact point of the receptacle 210 to circuitry within the diagnostic unit 250, which may detect that the EVSE connector 203 is connected to the receptacle 210, and thus, determine that the conductors are unexposed.

Additionally, or alternatively, other devices, such as a pressure sensor, infrared proximity sensor, magnetic sensor, etc., may be used to detect whether the EVSE connector 203 is present in the receptacle 210. Also, whether the EVSE connector 203 is present in the receptacle 210 may be detected by applying a stimulus on a conductor (e.g., the control pilot line CP) in the cable 204 and verifying whether the control electronics 207 detects the stimulus.

Further, in some embodiments, the diagnostic unit 250 may determine whether the conductors are exposed or not by detecting whether a closed circuit loop has been formed. That is, the diagnostic unit 250 may generate a test current to check whether the current may travel through the loop. If the diagnostic unit 250 receives the test current, then the diagnostic unit 250 may determine that the closed circuit loop has been formed (i.e., the EVSE connector 203 is present in the receptacle 210), and therefore, the conductors of the EVSE 200 are not exposed. Such a test may use a low test current to ensure safety. Further, the diagnostic unit 250 may require that this test be performed successfully multiple times before arriving at the conclusion that the conductors of the EVSE 200 are not exposed.

In some cases, when the EVSE 200 is connected to an electric vehicle 101, the conductors of the EVSE 200 may be considered to be in the exposed state. Meanwhile, in other cases, when the EVSE 200 is connected to an electric vehicle 101, the conductors of the EVSE 200 may be considered to be in the unexposed state. Also, the diagnostic unit 250 may determine that the state of the conductors may change when the EVSE 200 completely charges the electric vehicle 101, even if the EVSE connector 203 remains connected to the electric vehicle 101. Thus, the diagnostic unit 250 may determine that the conductors have changed from the unexposed state to the exposed state, or vice versa, when the electric vehicle 101 has finished charging.

Further, the diagnostic unit 250 may determine when (e.g., a timestamp at which) the EVSE connector 203 is connected to and disconnected from the receptacle 210. Moreover, the diagnostic unit 250 may record how long conductors of the EVSE 200 are in an exposed state. By tracking the time that conductors of the EVSE 200 are exposed, the diagnostic unit 250 may determine various scenarios and may alert different people (e.g., users, owners, operators, etc.) accordingly. For example, if the conductors of the EVSE 200 are determined to be exposed for 30 continuous minutes, the diagnostic unit may determine that the EVSE 200 is inoperable or that the cable 204 has been stolen.

Additionally, by monitoring the exposed and unexposed state of the conductors, the diagnostic unit 250 may assist in initiating and closing billing transactions. For example, when the diagnostic unit 250 detects that the conductors are in the exposed state and that current is passing through one or more of the conductors (e.g., the first power line L1 and the second power line L2/N), the diagnostic unit 250 may determine that an electric vehicle 101 is being charged and may initiate a billing transaction. In contrast, when, for example, the diagnostic unit 250 detects that the conductors are in the unexposed state and that current is passing through the conductors, the diagnostic unit 250 may determine that diagnostic functions are being performed and that a billing transaction should not be initiated.

Furthermore, the diagnostic unit 250 may control a locking mechanism on the receptacle 210 and/or EVSE connector 203. Specifically, when the diagnostic unit 250 determines that the performance and/or electrical characteristics of the EVSE 200 might be compromised (or otherwise undesirable), the diagnostic unit 250 may control the locking mechanism to lock the receptacle 210 and EVSE connector 203 together so that the EVSE connector 203 cannot be removed. For example, if the diagnostic unit 250 determines that current arcing might occur, the diagnostic unit 250 may output a signal to lock the EVSE connector 203 to the receptacle 210 to prevent a user from using the EVSE 200 to charger his/her electric vehicle 101. The locking mechanism may be any known locking mechanism.

In one or more arrangements, regardless of the diagnostic functions of the diagnostic unit 250, the diagnostic unit 250 may be configured to receive power from another source separate from the power supply provided to the conductors of the cable 204. And, in some cases, the diagnostic unit 250 may even include its own power supply. That is, a power supply may be designated for the diagnostic unit 250. Further, the power supply of the diagnostic unit 250 may be backed up by a generator to prolong the operational state of the diagnostic unit 250. By using a separate power supply, the diagnostic unit 250 may be uninfluenced from a possible failure occurring in the rest of the EVSE 200. Thus, the diagnostic unit 250 may still be able to operate even when there is a problem with the power supplied to the cable 204 or control electronics 207.

As shown in FIG. 2, the diagnostic unit 250 may be electrically coupled to the control electronics 207. In one or more arrangements, the connection between the diagnostic unit 250 and control electronics 207 may facilitate bidirectional communications. For example, the diagnostic unit 250 may direct the control electronics 207 to open/close the contactor 206. And, in the same embodiment, the control electronics 207 may transmit results of the monitoring circuit 209 (e.g., voltage levels detected by the monitoring circuit 209) to the diagnostic unit 250. Another example communication may include the diagnostic unit 250 informing the control electronics 207 that the EVSE connector 203 is connected to the receptacle 210, as opposed to an electric vehicle 101. Therefore, the EVSE 200 may distinguish the connection of the EVSE connector 203 to the receptacle 210 from the connection of the EVSE connector 203 to the electric vehicle 101. As a result, the EVSE 200 may not attempt to charge an electric vehicle 101 when the EVSE connector 203 is connected to the receptacle 210. In particular, the control electronics 207 may refrain from supplying power (e.g., may refrain from closing the contactor 206) in response to receiving a signal from the monitoring circuit 209 when the EVSE connector 203 is connected to the receptacle 210. It should be understood that the control electronics 207 may be implemented with various configurations to communicate with the diagnostic unit 250 and to assist the diagnostic unit 250 in performing one or more of the functions described herein.

Another aspect of the diagnostic unit 250 may be to alert a user, owner, operator, or anyone else interested in any of the determinations reached by the diagnostic unit 250. For example, when the diagnostic unit 250 is configured to determine that there is or was an insulation breakdown between two conductors, the diagnostic unit 250 may alert the owner of this determination so that the owner may take an appropriate action, such as ordering replacement parts, fixing the EVSE 200, etc. Herein, alerting may include any method of indication, such as sounding an alarm, turning on/off a light, transmitting a signal (e.g., digital signal) to a computing device (e.g., a phone, laptop, etc.), performing a mechanical process (moving an indicator member or sign), etc. Different alerts may be used for different diagnostic results. For example, if the diagnostic unit 250 determines that arcing may occur, the diagnostic unit may sound an alarm or flash a light warning users that the EVSE 200 is unsafe. Whereas, if the diagnostic unit 250 determines that the contact resistance of a conductor is too high, the diagnostic unit 250 may simply send a message to the owner or operator of the EVSE 200 informing him/her of the problem, and thus, not alert potential customers. In some embodiments, the diagnostic unit 250 may even send a message ordering the replacement parts it determines are defective.

Figure 3:
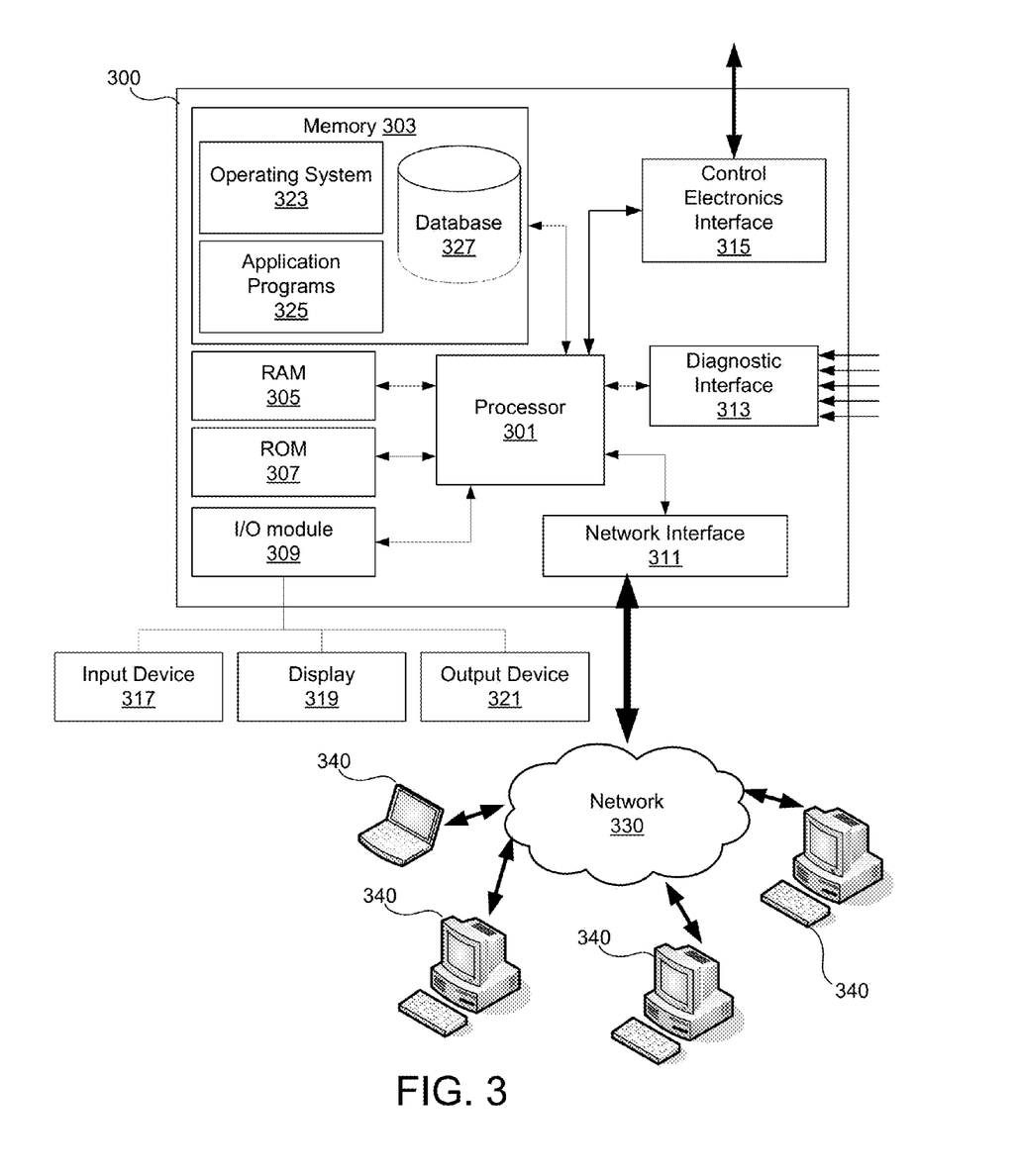
FIG. 3 is a block diagram of an example computing device that may be used according to an illustrative embodiment of the present disclosure.

FIG. 3 illustrates a block diagram of an example computing device 300 that may be used according to an illustrative embodiment of the present disclosure. In one or more embodiments of the present disclosure the computing device 300 may be incorporated into the diagnostic unit 250. The computing device 300 may have a processor 301 that may be capable of controlling operations of the computing device 300 and its associated components, including memory 303, RAM 305, ROM 307, an input/output (I/O) module 309, a network interface 311, a diagnostic interface 313, and a control electronics interface 315.

The I/O module 309 may be configured to be connected to an input device 317, such as a microphone, keypad, keyboard, touch screen, and/or stylus through which a user of the computing device 300 may provide input data, such as instructions to execute a specific diagnostic test. The I/O module 309 may also be configured to be connected to a display 319, such as a monitor, television, touchscreen, etc., and may include a graphics card. Thus, in some embodiments, the input device 317 and/or display 319 may provide a graphical user interface for the computing device 300. The display 319 and input device 317 are shown as separate elements from the computing device 300; however, they may be within the same structure in some embodiments. Additionally, the I/O module 309 may be configured to connect to an output device 321 (e.g., a light, an alarm, a mechanical sign, a second display (in addition to the display 319) for displaying a digital sign, etc.), which may be configured to indicate a status of the EVSE 200 (e.g., a condition of the EVSE 200, an availability of the EVSE 200, a risk associated with the EVSE 200, etc.) based on results of a diagnostic test. The processor 301, through the I/O module 309, may control the output device 321 to notify a user, owner, operator, etc. of a problem with the EVSE 100, 200. For example, the processor 301 may determine that the insulation of a conductor has been damaged, and therefore, may send a signal to the output device 321 alerting a potential user that the EVSE 100, 200 is out of order.

The memory 303 may be any computer readable medium for storing computer-executable instructions (e.g., software). The instructions stored within memory 303 may enable the computing device 300 to perform various functions. For example, memory 303 may store computer-executable instructions for determining the condition of the EVSE 200 or its components (e.g., cable 204, EVSE connector 203, receptacle 210, etc.) based on measurements obtained from the diagnostic unit 250. Also, memory 303 may store criteria, such as thresholds, for making determinations disclosed herein. Moreover, memory 303 may store past measurements (e.g., may keep a measurement log) so that trends related to the condition of the components of the EVSE 100, 200 may be ascertained or for the purpose of establishing a reference for determining whether the current measurements are problematic. Further, memory 303 may store software used by the computing device 300, such as an operating system 323 and/or application programs (e.g., a control application) 325, and may include an associated database 327.

The network interface 311 allows the computing device 300 to connect to and communicate with a network 330. The network 330 may be any type of network, such as a wide area network (WAN) (e.g., the Internet) and a local area network (LAN). Through the network 330, the computing device 300 may communicate with one or more computing devices 340, such as laptops, notebooks, smartphones, personal computers, servers, etc. For example, the computing device 300 may send a signal indicating the status of the EVSE 200 through the network 330 to a phone or other computing device 340 for receipt by an owner or operator of the EVSE 200. The computing devices 340 may also be configured in the same manner as computing device 300. In some embodiments the computing device 300 may be connected to the computing devices 340 to form a "cloud" computing environment.

The network interface 311 may connect to the network 330 via communication lines, such as coaxial cable, fiber optic cable, hybrid-coaxial cable (HFC), twisted pair wires, Ethernet cable, universal serial bus (USB), etc. or wirelessly using a cellular backhaul, wireless standard 802.11, a Bluetooth connection, etc. In some embodiments, the network interface 311 may include a modem. Further, the network interface 311 may use various protocols, including Transfer Control Protocol/Internet Protocol (TCP/IP), User Datagram Protocol/Internet Protocol (UDP/IP), Ethernet, File Transfer Protocol (FTP), Hypertext Transfer Protocol (HTTP), PROFIBUS, Modbus TCP, DeviceNet, Common Industrial Protocol (CIP) etc., to communicate with other computing devices 340.

The diagnostic interface 313 may be configured to receive inputs from the diagnostic electronics of the diagnostic unit 250 and/or from the receptacle 210. The number of inputs received may vary from embodiment to embodiment and may be based on, in part, the number of conductors in the cable 204 electrically coupled to the receptacle 210. Via the diagnostic interface 313, the computing device 300 may input one or more electrical measurements (e.g., resistance, capacitance, etc.). The diagnostic interface 313 may then provide these measurements to the processor 301 for comparison with thresholds and/or past measurements. Further, the diagnostic interface 313 may buffer or store the signals received. In some embodiments, the diagnostic interface 313 may include one or more analog-to-digital converters (ADC).

Additionally, the control electronics interface 315 may be configured to communicate with the control electronics 207. Notably, the control electronics interface 315 may allow for bidirectional communication. Via the control electronics interface 315, the computing device 300 may output signals to, e.g., direct the control electronics 207 to open/close the contactor 206. Meanwhile, the control electronics interface 315 may also allow the computing device 300 to receive signals indicating whether, for example, the contactor 206 is open or closed. In some embodiments, the control electronics interface 315 may include one or more analog-to-digital converters (ADC) for converting analog signals received by the control electronics 207 into digital signals that may be read by the processor 301.

The computing device 300 may also be a mobile device so that it may be removably connected to the EVSE 200. Thus, the computing device 300 may also include various other components, such as a battery, speaker, and antennas (not shown). Further, where the computing device 300 is incorporated into the diagnostic unit 250, the computing device 300 may be configured so that it can be removably inserted into the diagnostic unit 250. In this manner, if the computing device 300 fails, it may be easily replaced without having to replace the entire diagnostic unit 250 or EVSE 200.

Figure 4:
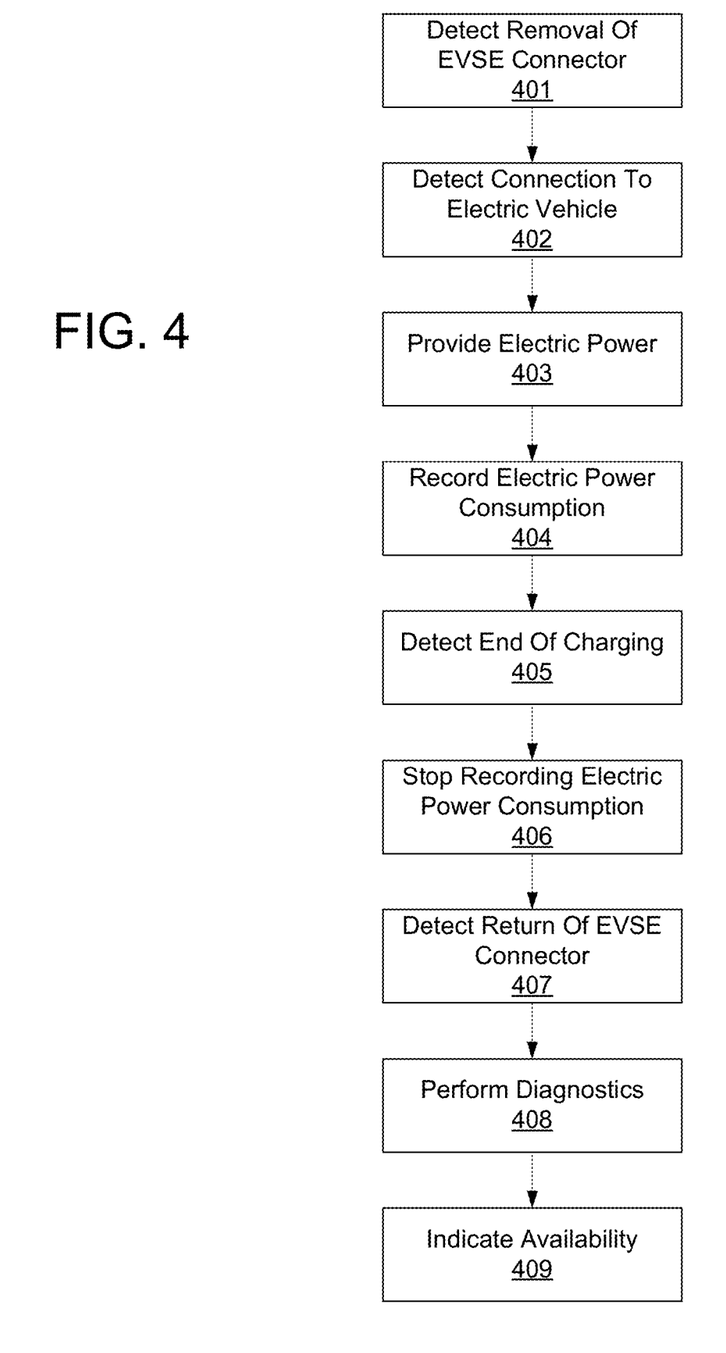
FIG. 4 illustrates a flow diagram for an example process in accordance with aspects of the present disclosure.

FIG. 4 illustrates a flow diagram of a method in accordance with an aspect of the present disclosure. Specifically, the method of FIG. 4 illustrates an example process of using an EVSE 100, 200. Although the below description mostly describes the steps of FIG. 4 being performed by the EVSE 200, it should be understood that the steps described with respect to FIG. 4 may be performed by any of the components disclosed herein. In particular, the steps may be performed by one or more processors 301 of one or more computing devices 300, which may be incorporated into the EVSE 100, 200 (or otherwise connected to the EVSE 100, 200). Where the steps are performed by a processor(s) 301, the steps may be performed as a result of the processor(s) 301 executing computer-executable instructions stored on a computer readable medium (e.g., CD, hard disk, flash drive, etc.).

The process in FIG. 4 begins with step 401 in which the EVSE 200 detects when the EVSE connector 203 is removed from the receptacle 210. The EVSE 200 may be removed from the receptacle 210 by a user wishing to charge his/her electric vehicle 101. In other cases, removal of the EVSE connector 203 may be unintentional or criminal. In some embodiments, the EVSE 200 may include intelligence for determining the cause of the removal. For example, the EVSE 200 may include a sensor or camera to detect the presence of an electric vehicle 101 to conclude that the EVSE connector 203 was removed for charging an electric vehicle 101.

Irrespective of the cause, the EVSE 200 may continuously monitor the status of the EVSE connector 203 so that it may detect a point (or period) in time when the EVSE connector 203 is removed from the receptacle 210. Specifically, the EVSE 200 may detect when the EVSE connector 203 is electrically disconnected from the receptacle 210. The EVSE 200 may determine that the EVSE connector 203 is removed when it receives a signal from the proximity circuit, which may generate such a signal when a contact point of the EVSE connector 203 is no longer electrically connected to a contact point in the receptacle 210.

Additionally, or alternatively, the EVSE 200 may include a sensor to detect the physical presence of the EVSE connector 203 so that it may determine when the EVSE connector 203 is removed from the receptacle 210. Accordingly, the receptacle 210 may be fitted with a magnetic sensor, a pressure sensor, and/or any other sensor that can detect movement of the EVSE connector 203.

In one or more arrangements, when the EVSE connector 203 is removed from the receptacle 210, a timestamp may be stored. Such a timestamp may be used in determining whether the EVSE 200 is damaged or that the EVSE connector 203 is exposed. For example, if a large amount of time has passed since the timestamp was generated, the EVSE 200 may determine that there is a problem.

In step 402, the EVSE 200 may detect whether the EVSE connector 203 has been connected to an electric vehicle 101. In some embodiments, the EVSE 200 may be configured to distinguish whether the EVSE connector 203 is connected to the receptacle 210 or an electric vehicle 101. Meanwhile, in other embodiments, the EVSE 200 might not be able to positively distinguish the two cases, but may determine that it is connected to the electric vehicle 101 as a result of determining that the EVSE connector 203 is electrically connected and that the connection is not to the receptacle 210.

In step 403, the EVSE 200 may begin providing electric power to the electric vehicle 101 (i.e., may begin charging the electric vehicle 101). Hence, step 403 may include controlling the contactor 206 to pass current in the first and second power lines L1 and L2/N. In one or more arrangements, the control electronics 207 may operate the contactor 206 in response to a signal received from the monitoring circuit 209. It is noted that the EVSE 200 might not begin providing electric power until a charge request is received. That is, electric power may only be supplied in response to receiving a request to charge from an electric vehicle 101 connected to the EVSE 200.

At or near the same time that step 403 is performed, the EVSE 200 may begin recording electricity consumption (e.g., in kilowatt-hours (kW h) or other units) at step 404. The EVSE 200 may record electricity consumption for generating a billing transaction in which a user is expected to pay for the electricity his/her car consumes. In some cases (e.g., where the EVSE 200 is for personal or private use), the EVSE 200 may simply record the electricity consumption for the user's information.

Next, at step 405, the EVSE 200 may detect when charging the electric vehicle stops. Charging may stop when a user selects to stop the charging (e.g., by pressing a button on the EVSE 200) or when the battery of the electric vehicle 101 becomes fully charged. When charging is stopped by the electric vehicle 101, the electric vehicle 101 stops transmitting a request to charge to the EVSE 200. Thus, the EVSE 200 may detect that charging has ended when it no longer receives a request to charge from the electric vehicle 101.

In response to detecting when charging the electric vehicle 101 stops at step 405, the EVSE 200 stops recording the electricity consumption at step 406. In some embodiments, stopping the recording of the electricity consumption may correspond to ending the billing transaction.

In step 407, the EVSE 200 may detect whether the EVSE connector 203 is returned in the receptacle 210. For example, the EVSE 200 may detect when the EVSE connector 203 is electrically connected to the receptacle 210. The process of detecting when the EVSE connector 203 is replaced in the receptacle 210 may be similar to the process used in step 401 to detect when the EVSE connector 203 is removed from the receptacle 210. Step 407 may include distinguishing a case in which the EVSE connector 203 is connected to the receptacle 210 from a case in which the EVSE connector 203 is connected to an electric vehicle 101.

Step 407 may include instructing a user to replace the EVSE connector 203 in the receptacle 210. Such instructions may be communicated to the user in response to detecting that charging has stopped at step 406. Also, these instructions may be communicated to the user using audio media, visual media, and/or audio-visual media. For example, the EVSE 200 may include a display for displaying a message to the user that he/she should replace the EVSE connector 203 in the receptacle 210. In another example embodiment, the EVSE 200 may display a video illustrating how the user should connect the EVSE connector 203 to the receptacle 210.

Step 407 may further include indicating whether the EVSE connector 203 is electrically connected to the receptacle 210. In some embodiments, it may be desirable to ensure that a suitable electrical connection is established between the EVSE connector 203 and the receptacle 210, as opposed to the EVSE connector 203 simply being placed in proximity to the receptacle 210. Therefore, step 407 may also notify the user, owner, or any other person that the EVSE connector 203 is not electrically connected to the receptacle 210. For example, step 407 may flash a light until a user electrically connects the EVSE connector 203 to the receptacle 210. Further, step 407 may incentivize a user to electrically connect the EVSE connector 203 to the receptacle 210 by not allowing the billing transaction to end until the user properly replaces the EVSE connector 203 in the receptacle 210 (e.g., electrically connects the EVSE connector 203 to the receptacle 210). That is, the EVSE 200 may indicate that it is billing a user (whether or not it actually is billing the user) until the user properly replaces the EVSE connector 203 in the receptacle 210 to encourage the user to do so. Additionally, or alternatively, the EVSE 200 may withhold a receipt of the billing transaction or not allow a user to pay until the EVSE connector 203 is properly replaced in the receptacle 210. Moreover, to ensure an adequate electrical connection between the EVSE connector 203 and the receptacle 210, step 407 may wait for a predetermined time period (e.g., three seconds) before discontinuing whatever process is used to alert or encourage a user to connect the EVSE connector 203 to the receptacle 210.

In step 408, the EVSE 200 may perform diagnostics. Notably, diagnostics may be performed whether or not the EVSE 200 detects that the EVSE connector 203 is electrically connected to the receptacle 210. In some cases, the EVSE 200 may be damaged such that the EVSE 200 does not detect that the EVSE connector 203 is electrically connected to the receptacle 210 when in fact it is connected. Therefore, in light of this potential situation, the EVSE 200 may perform the diagnostics in step 408 even though it does not detect that the EVSE connector 203 is connected to the receptacle 210. For example, after a certain period of time passes, the EVSE 200 may perform diagnostics irrespective of the location of the EVSE connector 203. As a result, the EVSE 200 may determine whether there is a problem with the EVSE 200 (e.g., a problem with the EVSE connector 203, cable 204, receptacle 210, etc.), instead of assuming the EVSE connector 203 has not been replaced in the receptacle 210.

Further, this disclosure acknowledges that certain diagnostics performed at step 408 may require a closed loop circuit because they may rely on measurements that can only be taken on a closed loop circuit. That is, the EVSE 200 may only be able to properly perform certain tests if the EVSE connector 203 is connected to the receptacle 210. In light of this realization, the EVSE 200 may choose to perform different diagnostics depending on whether the EVSE connector 203 is determined to be in the receptacle 210 or not. Therefore, the EVSE 200 may include intelligence for selecting which diagnostics to perform and/or an order in which to perform them based on its determination of whether the EVSE connector 203 is connected to the receptacle 210. For example, if the EVSE 200 determines that the EVSE connector 203 is not connected to the receptacle 210, it may choose to perform certain tests that do not require a closed circuit loop before performing other tests that do require a closed circuit loop.

The EVSE 200 may indicate its availability at step 409. When the EVSE 200 is safe to use, properly functioning, and/or not in use, the EVSE 200 may be available. In contrast, when the EVSE 200 is in poor condition, not functioning properly (or at all), undergoing testing, and/or being used for charging an electric vehicle 101, the EVSE 200 may be unavailable. The EVSE 200 may determine its availability based on results of the diagnostics performed in step 408. For example, if the diagnostics determine that the cable 204 includes an unacceptable discontinuity, the EVSE 200 may indicate that it is unavailable. Indicating the availability of the EVSE 200 in step 409 may comprise any process, such as turning on/off a light, changing the color of a light (e.g., from red to green), displaying a message, generating an audible signal, etc. Moreover, the indication may be intended to notify any person, including a present user, a potential user, an owner, an operator, a manufacturer, a bystander, etc.

Aspects of the disclosure have been described in terms of illustrative embodiments thereof. Numerous other embodiments, modifications, and variations within the scope and spirit of the appended claims will occur to persons of ordinary skill in the art from a review of this disclosure. For example, one of ordinary skill in the art will appreciate that the steps illustrated in the illustrative figures may be performed in other than the recited order, and that one or more steps illustrated may be optional in accordance with aspects of the disclosure.

What is claimed is:

1. A method comprising:
   detecting, by electric vehicle supply equipment configured to provide electric power to an electric vehicle, whether a connector of the electric vehicle supply equipment is electrically connected to a receptacle of the electric vehicle supply equipment;
   obtaining, by the electric vehicle supply equipment, electrical measurements at an end of one or more conductors accessible via the connector;
   determining a status of the one or more conductors based on the obtained electrical measurements; and
   indicating whether the electric vehicle supply equipment is available for use.

2. The method of claim 1, wherein the detecting whether the connector of the electric vehicle supply equipment is electrically connected to the receptacle of the electric vehicle supply equipment comprises:
   closing a switch in the connector after the connector is electrically connected to the receptacle; and
   detecting, by the electric vehicle supply equipment, whether the switch is closed.

3. Electric vehicle supply equipment, comprising:
   a control box comprising control electronics configured to control whether current passes through a plurality of power lines;
   a connector comprising a first end and a second end, the second end being configured to connect to an inlet of an electric vehicle;
   a cable extending from a first part of the control box to a first end of the connector and comprising the plurality of power lines, wherein the plurality of power lines are configured to connect to an electric power source and provide electricity through the cable to the first end of the connector to supply electric power to an electric vehicle;
   a receptacle located on a second part of the control box and configured to electrically connect to the connector through the second end of the connector; and
   a diagnostic unit configured to perform a diagnostic test on a particular conductor within the connector when the connector is electrically connected to the receptacle.

4. The electric vehicle supply equipment of claim 3, wherein the particular conductor comprises any one of a plurality of conductors accessible via the receptacle of the electric vehicle supply equipment, the plurality of conductors comprising the plurality of power lines, a proximity line, a control pilot line, and a ground line.

5. The electric vehicle supply equipment of claim 3,
wherein the diagnostic unit is configured to generate a stimulus and transmit the stimulus onto the particular conductor within the connector when the connector is electrically connected to the receptacle, and
wherein the diagnostic test comprises measuring one of a continuity of the particular conductor, a resistance or impedance of the particular conductor, a capacitance between the particular conductor and another conductor, a leakage current of the particular conductor, a pulse width or frequency of a pulse width modulated signal on the particular conductor, a time between transmission and reception of a reflected signal transmitted on the particular conductor, a time to open or close a contactor, or a contact resistance of the particular conductor.

6. The electric vehicle supply equipment of claim 3, further comprising:
an output device configured to indicate a status of the electric vehicle supply equipment based on results of the diagnostic test,
wherein the diagnostic test comprises determining whether the particular conductor is damaged or whether an insulation of the particular conductor is damaged.

7. The electric vehicle supply equipment of claim 3, further comprising:
the control electronics configured to control whether current passes through the plurality of power lines,
wherein the diagnostic unit is electrically connected to the control electronics.

8. The electric vehicle supply equipment of claim 3, further comprising:
a monitoring circuit configured to detect a voltage at an end of the particular conductor,
wherein the voltage is controlled by the diagnostic unit, and
wherein the diagnostic unit is configured to determine whether the monitoring circuit is functioning properly.

9. The electric vehicle supply equipment of claim 3, wherein the diagnostic unit is configured to distinguish a case in which the connector is electrically connected to an electric vehicle and a case in which the connector is electrically connected to the receptacle of the electric vehicle supply equipment.

10. The electric vehicle supply equipment of claim 3,
wherein the particular conductor has a first end coupled to the first part of the control box and a second end electrically connected to the connector, and
wherein the receptacle is further configured to electrically connect to the particular conductor through the connector.

11. The electric vehicle supply equipment of claim 3, further comprising:
a proximity circuit configured to detect whether the connector is electrically connected to the receptacle, wherein the proximity circuit comprises a switch configured to close while the connector is electrically connected to the receptacle.

12. The electric vehicle supply equipment of claim 11, wherein the switch is actuated by one of:
a mechanical device configured to close the switch when conductive contact points of the connector physically contact conductive contact points of the receptacle; or
a manual device configured to close the switch in response to a user's action in addition to moving the connector so that the conductive contact points of the connector physically contact the conductive contact points of the receptacle.

13. The electric vehicle supply equipment of claim 3, wherein the connector comprises one or more conductive contact points and the receptacle comprises one or more conductive contact points arranged to electrically connect to each of the conductive contact points of the connector, respectively.

14. The electric vehicle supply equipment of claim 3,
wherein the connector allows access to an end of each of the plurality of power lines, a proximity line, a control pilot line, and a ground line, and
wherein the receptacle comprises a plurality of conductive contact points arranged to electrically connect to each of the accessible ends, respectively.

15. Electric vehicle supply equipment, comprising:
a control box comprising control electronics configured to control whether current passes through a plurality of power lines, the plurality of power lines configured to supply electric power to an electric vehicle, each of the power lines having a first end electrically coupled to an electric power source;
a connector comprising a first end and a second end, the second end being configured to electrically connect a second end of each of the plurality of power lines to an electric vehicle;
a cable extending from a first part of the control box to a first end of the connector;
a receptacle located on a second part of the control box and configured to directly and electrically connect to the second end of the connector; and
a diagnostic unit electrically connected to the receptacle and configured to perform a diagnostic test on a particular conductor within the connector when the connector is electrically connected to the receptacle,
wherein the particular conductor comprises any one of a plurality of conductors accessible via the receptacle, the plurality of conductors comprising the plurality of power lines, a proximity line, a control pilot line, and a ground line.

16. The electric vehicle supply equipment of claim 15,
wherein the particular conductor has a first end electrically connected to the control electronics and a second end electrically connected to the connector,
wherein the receptacle is configured to electrically connect to the particular conductor through the connector.

17. The electric vehicle supply equipment of claim 15, wherein the diagnostic test comprises determining whether the particular conductor is in an exposed or unexposed state.

18. The electric vehicle supply equipment of claim 15, wherein the diagnostic unit comprises diagnostic electronics that are electrically isolated from the plurality of power lines.

19. The electric vehicle supply equipment of claim 15, further comprising:
an output device configured to indicate a status of the electric vehicle supply equipment based on results of the diagnostic test,
wherein the diagnostic test comprises determining whether the particular conductor is damaged or whether an insulation of the particular conductor is damaged.

20. The electric vehicle supply equipment of claim 19, wherein the output device comprises one of an audible alarm, a light, a mechanical sign, or a display.

* * * * *